United States Patent [19]

Lee

[11] Patent Number: 5,675,261

[45] Date of Patent: Oct. 7, 1997

[54] PROBE CARD LOCKING DEVICE OF A PROBE STATION FOR TESTING A SEMICONDUCTOR WAFER

[75] Inventor: Dong-Seck Lee, Kyoungki-do, Rep. of Korea

[73] Assignee: Hyundai Electronics Industries Co., Ltd., Ich'on, Rep. of Korea

[21] Appl. No.: 624,136

[22] Filed: Mar. 29, 1996

[30] Foreign Application Priority Data

Apr. 6, 1995 [KR] Rep. of Korea ............... 95-7934

[51] Int. Cl.[6] ............................................. G01R 31/02
[52] U.S. Cl. ............................................. 324/754
[58] Field of Search ........................... 324/754, 755, 324/158.1, 73.1, 72.5, 761; 439/482, 331; 269/70, 69

[56] References Cited

U.S. PATENT DOCUMENTS

| | | | |
|---|---|---|---|
| 5,124,646 | 6/1992 | Shiraishi | 439/482 |
| 5,471,148 | 11/1995 | Sinsheimer et al. | 324/754 |
| 5,489,853 | 2/1996 | Nakajima | 324/754 |
| 5,521,522 | 5/1996 | Abe et al. | 324/754 |
| 5,568,056 | 10/1996 | Ishimoto | 324/754 |

*Primary Examiner*—Vinh P. Nguyen
*Attorney, Agent, or Firm*—Ware, Fressola, Van Der Sluys & Adolphson LLP

[57] ABSTRACT

A probe card locking device for a probe station performs a characteristics test or the like by contacting probes to respective dies of a wafer subjected to a predetermined unit process in a semiconductor analysis system. A pair of cylinders operated by air supplied to the probe system upwardly and downwardly operate support members respectively connected to the cylinders to lock probe cards to frames. Thus, the damage upon the probe card and inferior wafer resulting from the possible drop of the pressing bolt is prevented to enhance stability when operating the system.

3 Claims, 4 Drawing Sheets

PROBE CARD LOCKING DEVICE OF A PROBE STATION FOR TESTING A SEMICONDUCTOR WAFER

BACKGROUND OF THE INVENTION

1. Field of the Invention

The present invention relates to a probe station for testing a semiconductor wafer, and more particularly to a probe card locking device of the probe station for testing the wafer capable of automatically locking the probe card to a test head thereof using air supplied to the station.

2. Description of the Prior Art

Probing is one kind of semiconductor analysis method which includes a characteristics test to respective chips and the like on the semiconductor wafer processed by a predetermined unit process. The probing is performed by a device for testing the characteristics of a corresponding chip by setting up a probe on a transistor or pad of an IC chip. There is illustrated an E-BEAM probe station as above device such as the IDS 5000 E-BEAM probe station, Schlumberger Co. in the United States in FIG. 1.

In the E-BEAM probe station such as the IDS 5000 E-BEAM probe station shown in FIG. 1, a workbench 3 is supported by main body 1 and a work station 2. A test head 4 is installed on the upper portion of the main body 1. The work station 2 is provided with a control computer 5, and a key board 6 is placed between the main body 1 and the work station 2. The IDS 5000 E-BEAM probe station is a device for executing the characteristic test of a semiconductor wafer by means of E-beam, in which an E-beam gun 7 for emitting the E-beam to the probe card is installed within the main body 1 to be connected to test head 4. For supplying air to the semiconductor to eliminate foreign matter on the wafer, an air supply line 8 is installed to be connected to the test head 4.

FIG. 2 illustrates an installation of a probe card locking device 20 installed to the upper portion of the E-beam gun 7. The probe card locking device 20 is installed to the lower portion of a first portion 4a of the test head 4 which is constructed to be folded by means of a hinge 4c. A second portion 4b of the test head 4 is pivoted about hinge 4c to cover the first portion 4a when the semiconductor wafer is placed on first portion 4a and the testing is completely prepared, thereby covering first portion 4a.

FIG. 3 is a perspective view of a detailed structure of the probe card locking device 20 shown in FIG. 2. The conventional probe card locking device includes a pair of supports 21 installed in parallel to be fixed to the lower portion of the first portion 4a of the test head 4 and spaced apart from each other by a predetermined distance, a pair of guides 22 fixed to opposing planes of the supports 21 and formed with support step 22a for supporting both sides of a probe card 30, respectively, a pair of pressing members 23 formed respectively with a step 23a for downwardly pressing to secure both sides of the probe card 30 which are supported by the guides 22, and a plurality of engaging bolts 24 which separately engage the members 23 to the supports 21, respectively.

In order to lock the probe card 30, in the probe card locking device 20 as shown in FIG. 4, the plurality of locking bolts 24 which engage the pressing members 23 to the supports 21 are released, so that a space larger than the thickness of the probe card 30 for the testing is formed between respective support steps 22a of support members 22 and respective pressing steps 23a of locking members 23. Thus, probe card 30 can be mounted to support steps 22a.

Under this state, both sides of probe card 30 are pushed by respective support steps 22a of support members 22. Thereafter, locking members 23 disposed to the lateral upper portion of probe card 30 are respectively moved toward supports 21 to tightly close probe card 30 between support steps 22a of support members 22 and pressing steps 23a of locking members 23. That is, a plurality of locking bolts 24 coupled to respective supports 21 by penetrating through pair of locking members 23 are sequentially screwed. By doing so, probe card 30 is not floated between locking member 23 and locking guide 22. Also, a plurality of probes 13 supplied to probe card 30 are fixed to thoroughly contact a pad of a corresponding chip 25 of a semiconductor wafer 100 as shown in FIG. 4.

As described above, probe card locking device 20 of the probe station is provided with probe card 30 for actually attaining electrical connection to the chip of the semiconductor wafer which is subjected to the testing.

As shown in FIG. 4, probe card 30 is formed of a small-sized substrate 10 substantially shaped as a rectangle. A connecting pad 11 connected with an outside connection is formed to one side of the small-sized substrate 10 to be connected to work station 2 by a cable (not shown), etc. A plurality of probes 13 for transmitting/receiving signals by contacting chip 25 subjected to the testing of semiconductor wafer 100 are installed in a predetermined arrangement into a thruhole 12 formed in the center of the small-sized substrate 10.

Probe card 30 is disposed below wafer 100 provided to first portion 4a of test head 4, and probes 13 of probe card 30 placed as shown correspondingly contact with the pads of chip 25 in a one to one basis to transmit/receive signals, thereby performing the characteristics test of the corresponding chip. At this time, only by simultaneously contacting corresponding probe 13 of probe card 30 to an individual pad of the chip, the exactness of the test can be contrived. Thus, the accurate position setting of probe card 30 is very important in order to accurately fix the probe card 30 by means of the above-stated probe card locking device 20.

In order to mount the probe card in the conventional probe card locking device described as above, however, the plurality of locking bolts 24 for locking support members 22 to supports 21 are loosened, the probe card is pushed to be inserted between support members 22 and locking members 23, and then all locking bolts 24 are tightly driven for locking locking members 23 by using a tool such as a spanner to closely attach locking members 23 to support members 22. Therefore, the locking operation requires a good deal of fastidiousness, since the coupling force exerted upon respective locking bolts 24, if different, will result in an undesired displacement of the probe card. Furthermore, a lot of set-up time is required for correcting such problems.

Moreover, the conventional probe card locking device of which locking bolt 24 is separately provided over the probe card or semiconductor wafer adversely affects on the usage or safety of the system since locking bolt 24 can easily be dropped on the probe card or semiconductor wafer, thereby causing damage of the probe card, deterioration of the semiconductor wafer, etc.

SUMMARY OF THE INVENTION

Accordingly, it is an object of the present invention to provide a probe card locking device of a probe station for testing a wafer capable of facilitating an operation, solving an unbalance problem in locking a probe card and shortening set-up time.

It is another object of the present invention to provide a probe card locking device of a probe station for testing a wafer, in which locking bolts are not employed for preventing damage upon a probe card and an inferior wafer resulting from a possible drop of the locking bolt to enhance stability when operating a system.

To achieve the above object of the present invention, there is provided a probe card locking device of a probe station for testing a semiconductor wafer, which includes a pair of frames disposed in parallel with each other by a prescribed distance to a lower portion of a test head of a main body of the probe station. Also, a pair of pressing guides are respectively fixed to opposing planes of the frames and provided with support steps for supporting both sides of a probe card, and a pair of pressing members are provided with pressing steps for downwardly pressing to fix both sides of the probe card having both sides supported by the support steps by being supported by the support steps of the respective pressing guides. A pair of air cylinders are provided to both sides of an E-beam gun placed to a lower portion of the test head for being synchronously moved, and a pair of middle plates are connected to the air cylinders to support a plurality of elevation shafts connected to the pressing members via a pair of thruholes respectively formed in the frames.

Here, the pair of air cylinders are operated by air supplied via an air line connected to an air supply line for eliminating foreign matter on the semiconductor wafer. Preferably, an air pressure of the air cylinder ranges from 75 to 90 psi.

These and other objects, features and advantages of the present invention will become more apparent in light of the detailed description of a best mode embodiment thereof, as illustrated in the accompanying drawing.

DETAILED DESCRIPTION OF THE PREFERRED EMBODIMENT

Hereinafter, a preferred embodiment of the present invention will be described with reference to accompanying drawings.

Figure 1:
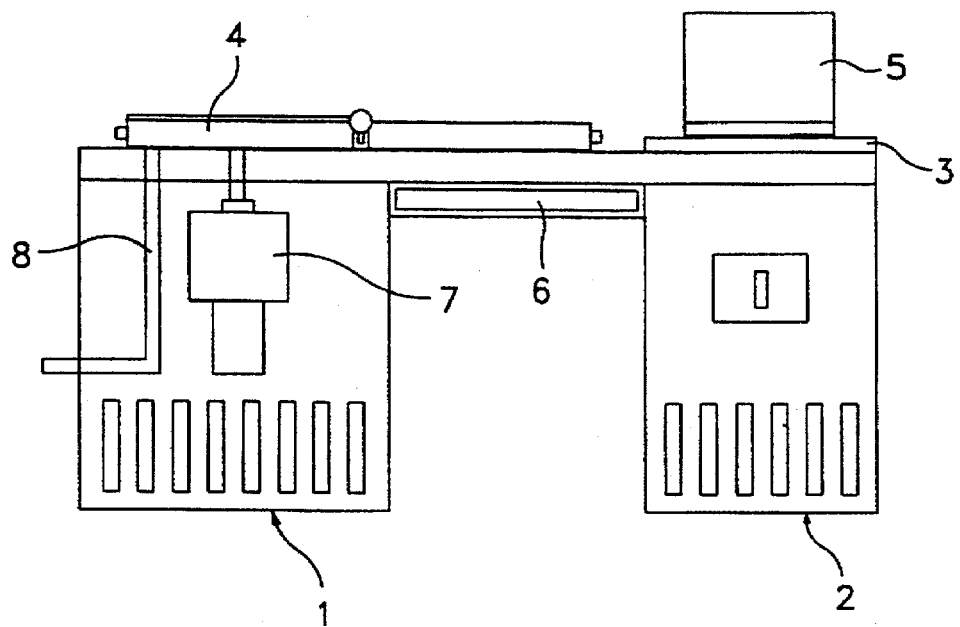
FIG. 1 is a schematic view showing a conventional probe station for testing a wafer.
Figure 2:
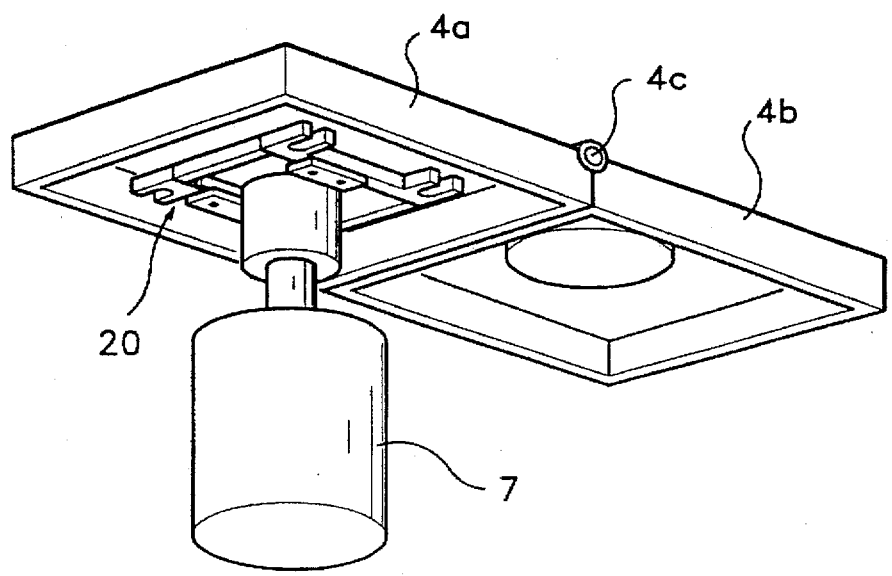
FIG. 2 is a view schematically showing the relation between the probe card locking device and test head installed to the E-beam gun of the probe station for testing the wafer shown in FIG. 1.
Figure 3:
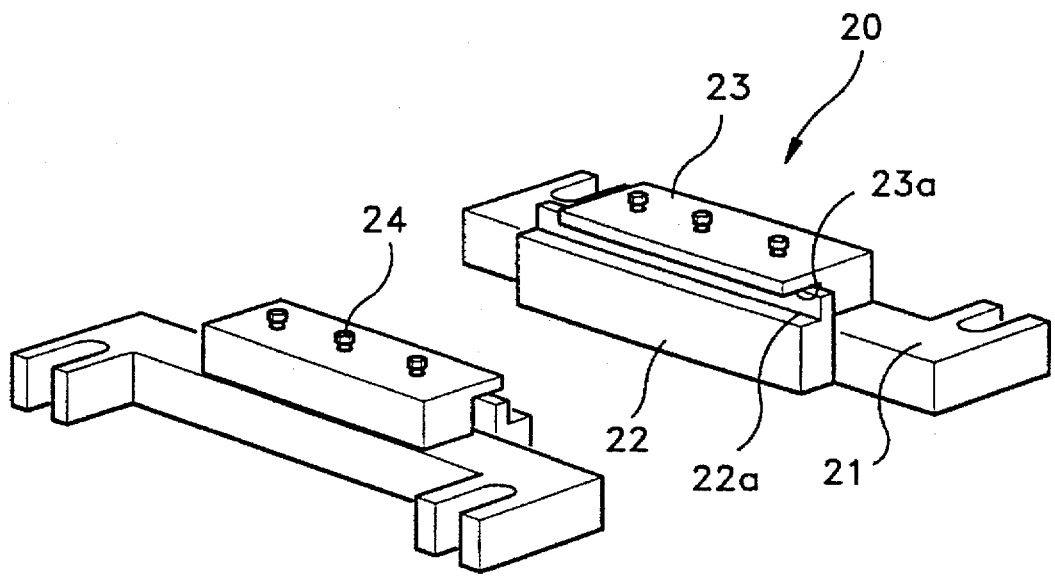
FIG. 3 is a perspective view of the probe card locking device shown in FIG. 2.
Figure 5:
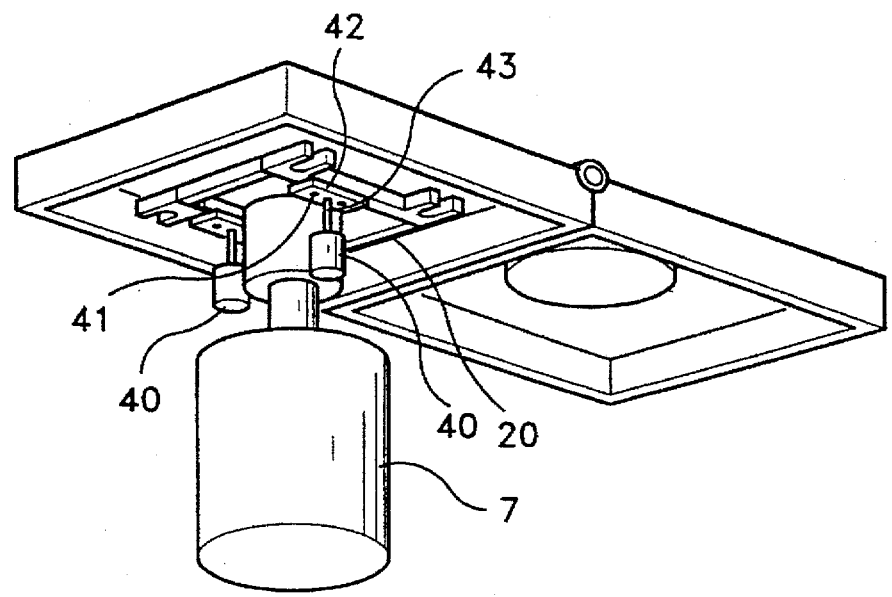
FIG. 5 is a view schematically showing the relation between a probe card locking device and a test head installed to an E-beam gun of a probe station for testing a wafer according to the present invention.

FIG. 5 is a view similar to FIG. 2, which illustrates the relation between a probe card locking device and a test head installed to an E-beam gun of a probe station for testing a wafer according to the present invention. As can be shown in FIG. 5, a pair of air cylinders 40 are installed on both sides of E-beam gun 7 placed at a lower portion of a test head 4 of the probe station for testing the wafer. Air cylinders 40 are operated by air supplied via an air line connected to an air supply line 8 for eliminating foreign matter on the semiconductor wafer.

Figure 6:
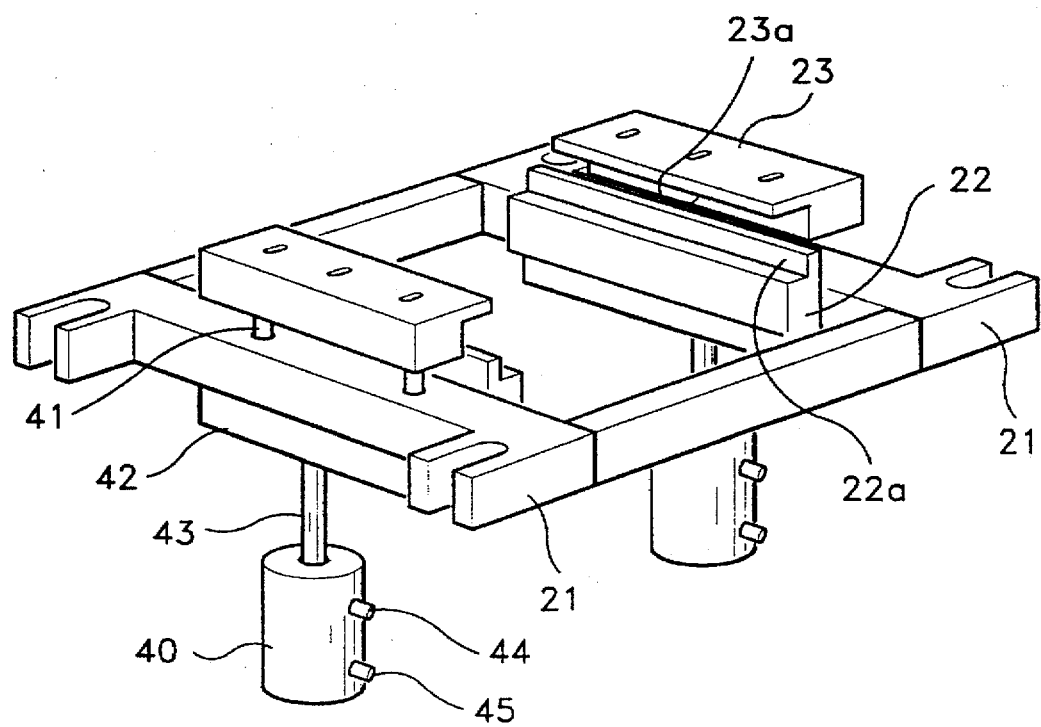
FIGS. 6 and 7 are perspective views showing a structure and an operating pattern of the probe card locking device according to the present invention.

Meanwhile, as shown in FIG. 6, in the probe card locking device according to the present invention, a pair of frames 21 are installed in parallel with each other by a prescribed distance to the lower portion of test head 4 by means of pressing units such as bolts. Frames 21 are provided with pressing guides 22 for guiding the fixation of the probe card on the inner opposing planes of them, and pressing members 23 are installed on the upper surface of frames 21 for pressing the probe card in cooperation with support members 22.

Step-like support steps 22a for supporting opposite sides of the probe card are respectively formed to support members 22 attached to the opposing planes of support steps 21. Also, step-like pressing steps 23a are formed to respective pressing members 23 to correspond to support steps 22a for downwardly and pressively fixing the opposite sides of the probe card supported by support steps 22a of support members 22.

Figure 7:
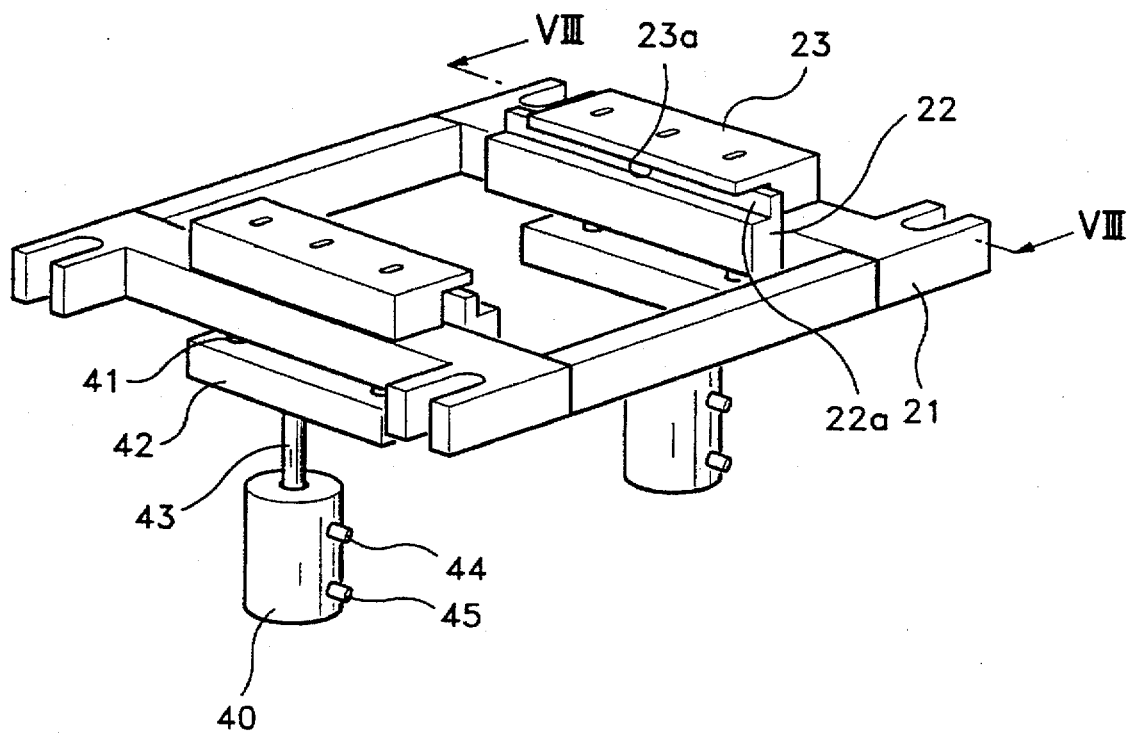
Figure 8:
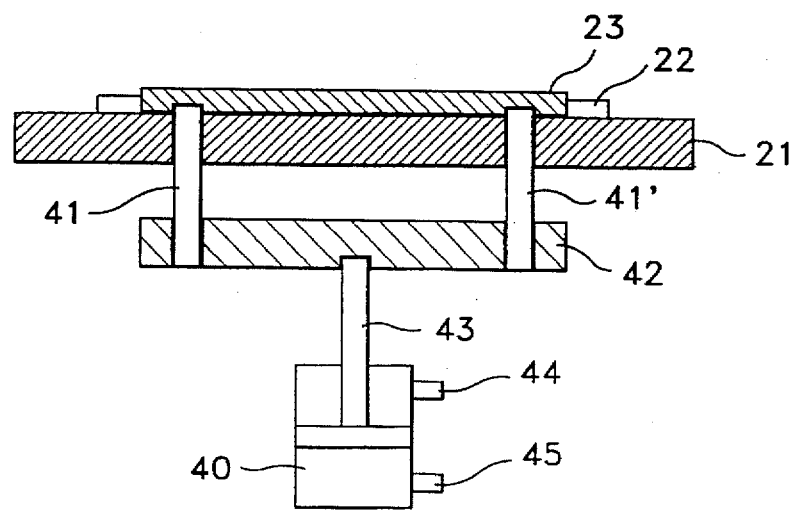
FIG. 8 is a sectional view showing the probe card locking device according to the present invention taken along line VIII—VIII of FIG. 7.

As shown in FIG. 6 as well as FIGS. 7 and 8, a pair of middle plates 42 connected to piston rods 43 of air cylinders 40 are installed to the lower portion of support members 22, and respective pairs of a plurality of, more preferably two pairs of elevation shafts 41 connected to pressing members 23 via a pair of thruholes formed in frames 21 are supported by respective middle plates 42.

Piston rod 43 of air cylinder 40 furnished to both sides of E-beam gun 7 according to the present invention is connected to the center of middle plate 42 which are supported by two pairs of elevation shafts 41 connected in pairs to respective pressing members 23 through the thruholes formed in frames 21 as described above. By this construction, frames 21 are operated in the position as shown in FIGS. 6 and 7 in accordance with the forward and backward movement of piston rods 43 of respective air cylinders 40.

Figure 4:
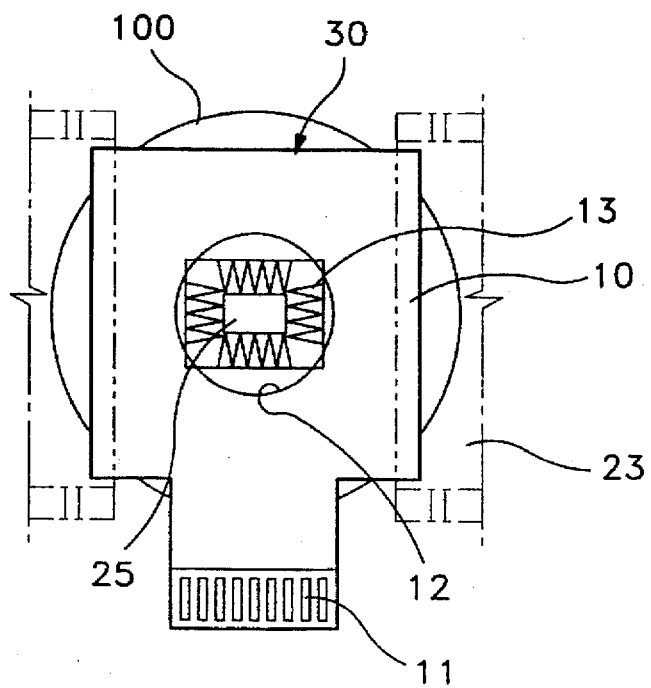
FIG. 4 is a plan view showing the relation between the probe card locked by means of the probe card locking device and the wafer.

In other words, FIG. 6 illustrates a state that, to separate pressing member 23 from pressing guide 22 for mounting the probe card to supporter 21, the air is supplied to a port 45 between ports 44 and 45 of air cylinders 40 for moving piston rods 43, 43' forward so that the piston rods advance forward to raise pressing member 23. In the state as shown in FIG. 6, the probe card slides between support steps 22a formed to the opposing planes of the pair of support members 22 in order to be set in a state such as shown in FIG. 4. While the probe card is inserted to the card locking device as shown in FIG. 4, the air is supplied to port 44 of air cylinder 40 for retracting the piston rods to thereby retract piston rod 43 as shown in FIG. 7 and lower pressing member 23. Thus, middle plate 42 connected with piston rod 43 retracts. By this backward movement of middle plate 42, pressing member 23 connected to middle plate 42 by elevation shafts 41 retreats to allow the probe card to be locked to supporter 21 by means of pressing guide 22.

In the above description, air cylinder 40 is driven by using the air supplied to the probe station system as a medium. At this time, it is preferable to set an air pressure to 75–90 psi. Also, pair of air cylinders 40 are synchronously operated to simultaneously operate respective middle plates 42 connected to piston rods 43.

While the air cylinder is employed as the power source for upwardly and downwardly moving the frames connected to the elevation shaft in the above-described embodiment, a motor or electro-magnet using electricity as the power source may be employed without being limited thereto. When the motor is utilized, a separate power conversion unit, i.e., a structure capable of changing the rotational force into the upward and downward linear movement may be utilized.

In the probe card locking device according to the present invention as described above in detail, the pressing operation of the probe card is automatically performed by the air cylinders connected to the air line for supplying the air to the probe station. Therefore, the operation is facilitated, unbalance caused during pressing the probe card is solved, and set-up time is shortened.

In contrast to the conventional art, pressing bolts are not employed in order to prevent damage to the probe card and thus an inferior wafer, thereby enhancing stability when operating the system.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A probe card locking device for a probe station for testing a semiconductor wafer comprising:

a pair of frames disposed in parallel with each other by a prescribed distance with respect to a lower portion of a test head of a main body of said probe station;

a pair of pressing guides respectively fixed to opposing planes of said frames and provided with support steps for supporting opposite sides of a probe card;

a pair of pressing members provided with pressing steps for downwardly pressing to fix the opposite sides of said probe card having said opposite sides supported by said support steps by being supported by said respective pressing guides;

a pair of air cylinders provided to both sides of an E-beam gun placed with respect to said lower portion of said test head for being synchronously moved; and a pair of middle plates connected to said air cylinders, for supporting a plurality of elevation shafts connected to said pressing members via a pair of thruholes respectively formed in said frames.

2. A probe card locking device for a probe station for testing a semiconductor wafer as claimed in claim 1, wherein said pair of air cylinders are operated by air supplied via an air line connected to an air supply for eliminating foreign matter on said semiconductor wafer.

3. A probe card locking device for a probe station for testing a semiconductor wafer as claimed in claim 1, wherein an air pressure of said air cylinder ranges from 75 to 90 psi.

* * * * *